(12) United States Patent
Fang et al.

(10) Patent No.: US 6,225,672 B1
(45) Date of Patent: May 1, 2001

(54) HIGH-GAIN AND HIGH-TEMPERATURE APPLICABLE PHOTOTRANSISTOR WITH MULTIPLE MONO-CRYSTALLINE SILICON-CARBIDE LAYERS ON A SILICON SUBSTRATE

(75) Inventors: Yean-Kuen Fang, Tainan; Kuen-Hsien Wu, Jen-Te Hsiang; Wen-Hsien Chuang, Taipei, all of (TW)

(73) Assignee: National Science Council of Republic of China, Taipei (TW)

( * ) Notice: Subject to any disclaimer, the term of this patent is extended or adjusted under 35 U.S.C. 154(b) by 0 days.

(21) Appl. No.: 09/129,230

(22) Filed: Aug. 5, 1998

(51) Int. Cl.[7] ..................................................... H01L 31/06
(52) U.S. Cl. ................................ 257/462; 257/76; 257/77
(58) Field of Search ............................... 257/462, 76, 77; 438/48, 309

(56) References Cited

U.S. PATENT DOCUMENTS 4,810,662 * 3/1989 Chang ..................................... 438/94
5,243,216 * 9/1993 Noguchi et al. ..................... 257/462
5,311,047 * 5/1994 Chang .................................. 257/198

FOREIGN PATENT DOCUMENTS 0 322 615 A1 * 7/1989 (EP) ............................. C30B/25/02

* cited by examiner

Primary Examiner—Minh Loan Tran
Assistant Examiner—Shouxiang Hu
(74) Attorney, Agent, or Firm—Bacon & Thomas, PLLC

(57) ABSTRACT

The present invention relates to the structure and fabrication process of a high-gain monocrystal Silicon Carbide phototransistor applicable at high temperature. In view of the optical gain and applicable temperature of the conventional n-p-n type Silicon Carbide phototransistor are too low for practical usage, the present invention utilizes a newly developed n-i-p-i-n structure to strengthen the intrinsic properties of the element, in order to enhance optical gain of the phototransistor for being able to operate at high temperature steadily.

9 Claims, 6 Drawing Sheets

HIGH-GAIN AND HIGH-TEMPERATURE APPLICABLE PHOTOTRANSISTOR WITH MULTIPLE MONO-CRYSTALLINE SILICON-CARBIDE LAYERS ON A SILICON SUBSTRATE

BACKGROUND OF THE INVENTION

1. Field of Technology

The present invention relates to techniques of inserting each of the two low impurity layers (i-layer) into base-collector and base-emitter respectively for a monocrystal Silicon Carbide (SiC) phototransistor, particularly to the construction and fabrication process of the low impurity layer and the phototransistor.

2. Prior Art

As more and more specified electronic devices are requested to operate under severe conditions, the demand of high-gain solid state sensing elements workable at high temperature subsequently grows up time to time. Unfortunately, most part of the known high-gain photodetectors, such as avalanche photodiodes (APD), phototransistors (PT), etc are made by using narrow bandgap materials like monocrystal silicon, amorphous silicon, or group III–V compounds. When temperature is elevated, dark current of the mentioned elements will increase rapidly to thus deteriorate photosensitivity thereof, so that, the operating temperature is confined less than 100° C. Pallab Bhattacharya, Seminductor Opto-electronic devices Englewood Cliffs, N.J.: Prentice Hall, 1944.

The wide bandgap semiconductor materials, such as Silicon Carbide (SiC), diamond, and gallium nitride (GaN), etc have been used to fabricate high temperature electronic elements lately Morkoc, S. Strite, G. B. Gao, M. E. Lin, B. S-verdlov, and M. Burns, "Largeband-gap SiC, III–V nitride, and II–VI ZnSe-based semiconductor device technologies," J. Appl. phys., vol. 76, no. 3, pp. 1363–1398, wherein the relative techniques of SiC is the most matured and most compatible with silicon ICs in fabricating process. SiC do have several vantage features, such as wide bandgap, high electron mobility, and high thermal conductivity, etc L. Harris, Propertis of Silicon Carbide. London, United Kingdom: INSPEC, the institution of Electrical Engineers, 1995. However, for the time being, the developments of high temperature SiC phototransistors are curbed due to lack of high-gains. This weakness is supposed to be brought about from a drastic recombination of minority carrier in the base of a conventional n-p-n construction thus lower current gain of a transistor and reduce optical gain accordingly B. Casady and R. W. Johnson, "Status of Silicon Carbide (SiC) as a Wide-bandgap Seminconductor for High-Temperature Applications: A Review, 'Solid-State Electronics, vol. 39, no. 10, pp. 1490–1422, 1996.

Aiming at the above-depicted defects, the present invention is to propose a newly developed construction and fabrication process for a high-gain monocrystal SiC phototransistor capable of operating at high temperature.

SUMMARY OF THE INVENTION

1. Objective of the Invention

The invention is intended to provide a high-gain phototransistor workable at high temperature. As the fabrication process is compatible with that of silicon semiconductor basically, it is advantageous for cutting down production cost and enhancing the relative techniques.

2. Description of Technology

In view of the fact that the present high-gain photodetectors made by silicon amorphous silicon or materials of group IV–V can only operate at temperature lower than 100° C., while Silicon Carbide (SiC) phototransistors of n-p-n type have a gain too poor to fit practical applications, hence, this invention has chosen a newly developed n-i-p-i-n structure for making monocrystal SiC phototransistor. This choice is also based on an exemplification made to point out that amorphous silicon n-i-p-i-n phototransistors have larger optical gain with lesser noise comparing with that of n-p-n type B.S. Wu, C. Y. Chang, Y. K. Fang, and R. H. Lee, "Amorphous Silicon Phototransistoron a Glass Substrate," IEEE Trans. On Electron Devices, vol. ED-32, no. 11, pp. 2192–2196, 1985 and C. Y. Chang, J. W. Hong, and Y. K. Fang, "Amorphous Si/SiC phototransistors and avalanche photodiodes," IEE Proceedings-J, vol. 138, no. 3, pp. 226–233, 1991.

The monocrystal SiC phototransistor, grown on a silicon substrate, is basically formed by a 5-layer structure sequentially comprising collector electrode (ITO)/collector (n-type monocrystal SiC)/$i_1$ low impurity layer (i-type monocrystal SiC)/base (p-type monocrystal SiC)/$i_2$ low impurity layer (i-type monocrystal SiC)/emitter (n-type monocrystal SiC) (refer to FIG. 1). In addition, a silicon wafer is employed as the indispensable substrate, and a buffer layer added is to reduce effect of lattice mismatch between silicon and Silicon Carbide for obtaining better quality SiC film. It is clear that the present invention has two extra low impurity layers interfacing base-emitter as well as base-collector respectively than a conventional n-p-n phototransistor.

The element of the present invention is designed to thoroughly deplete the base and the two low impurity layers under zero bias, and a triangular potential barrier is formed between the collector and emitter (refer to FIG. 2A). When bias $V_{CE}$ ($V_{CE}>0$) and illumination is applied simultaneously, photo-induced electrons start moving toward collector, while holes move in the opposite direction. Some of the holes may accumulate in the barrier region and neutralize some negative space charges to lower down the barrier potential (as shown in FIG. 2b). Consequently, a large optical gain may be thus obtained inasmuch as much more electrons can move over a lowered barrier to gather and form a relatively larger current. Because of the difference in conduction mechanism between n-i-p-i-n type and n-p-n phototransistor, though the minority carrier recombination may also occur in the former, the effect to optical gain is rather smaller comparing with result of lowered potential barrier. Therefore, a far larger optical gain may be obtained in a SiC n-i-p-i-n phototransistor than that of a SiC n-p-n type.

Furthermore, the lowered quantity of potential barrier in n-i-p-i-n type phototransistor B. S. Wu, C. Y. Chang, Y. K. Fang, and R. H. Lee, "Amorphous Silicon Phototransistoron a Glass Substrate," IEEE Trans. On Electron Device, vol. ED-32, no. 11, pp. 2192–2196, 1985 may be expressed as $\Delta\phi_b = (KT/q)\ln(q\phi_L J_d)$ where $\phi L$ is photo-carrier flux, $J_d$ is dark current.

From above formula, we understand that when temperature goes up, an increment in $J_d$ will inevitably cause a decrement in $\Delta\phi_b$, however, a larger T will result in a greater $\Delta\phi_b$, and this compensation function can reduce effect of temperature fluctuation to $\Delta\phi_b$, and so to photocurrent. In other words, the optical gain of n-i-p-i-n type phototransistors is relatively temperature-independent. Consequently, by combination with high temperature characteristics of SiC, the SiC n-i-p-i-n type phototransistor can obtain a far greater optical gain than that of SiC n-p-n type.

BRIEF DESCRIPTION OF THE DRAWINGS

The drawings disclose an illustrative embodiment of the present invention, which serves to exemplify the various advantages and objects hereof, and are as follows:

FIG. 2 is an energy band diagram of n-i-p-i-n type monocrystal SiC Phototransistor;

FIG. 3 denotes i-v relations under different temperatures of n-i-p-i-n type monocrystal SiC phototransistor;

Symbol remarks:
11: Collector electrode;
12: Collector;
13: Low impurity layer;
14: Base;
15: Low impurity layer;
16: Emitter;
17: Buffer layer;
18: Silicon substrate;
19: Emitter electrode;
41: Characteristic curve of n-i-p-i-n monocrystal SiC phototransistor under illumination;
42: Characteristic curve of n-i-p-i-n monocrystal SiC phototransistor without illumination;
43: Characteristic curve of n-p-n monocrystal phototransistor under illumination;
44: Characteristic curve of n-p-n monocrystal phototransistor without illumination;
51: Curve of n-i-p-i-n type monocrystal phototransistor;
52: Curve of n-p-n type monocrystal phototransistor;
61: Curve of n-i-p-i-n type monocrystal phototransistor;
62: Curve of n-p-n type monocrystal phototransistor;
63: Curve of n-i-p-i-n type silicon phototransistor;
64: Curve of n-p-n type silicon phototransistor.
Å=angstrom

DETAILED DESCRIPTION OF THE PREFERRED EMBODIMENT

[Preferred embodiment 1]

Figure 1:
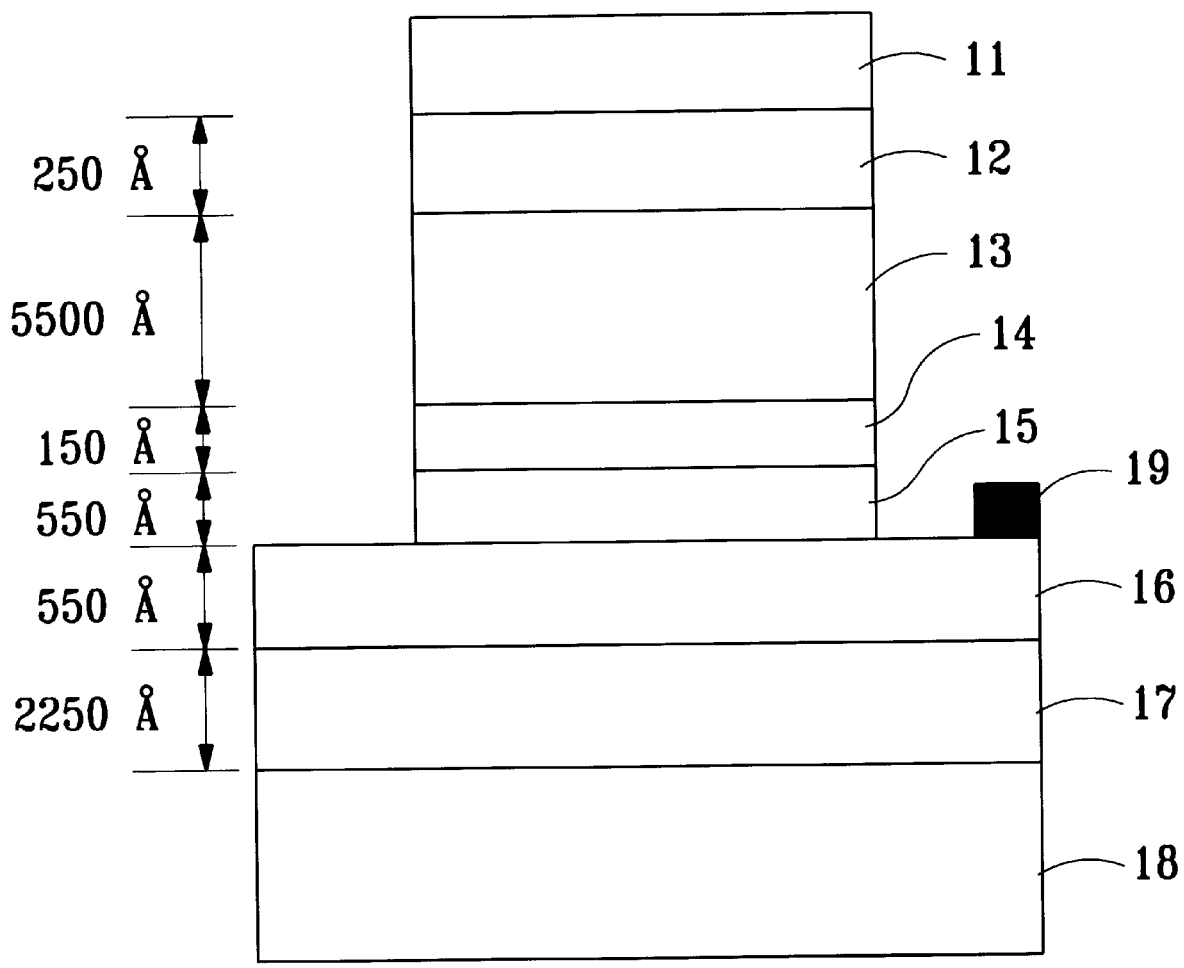
FIG. 1 is a structure view of n-i-p-i-n type monocrystal SiC phototransistor.
Figure 2A:
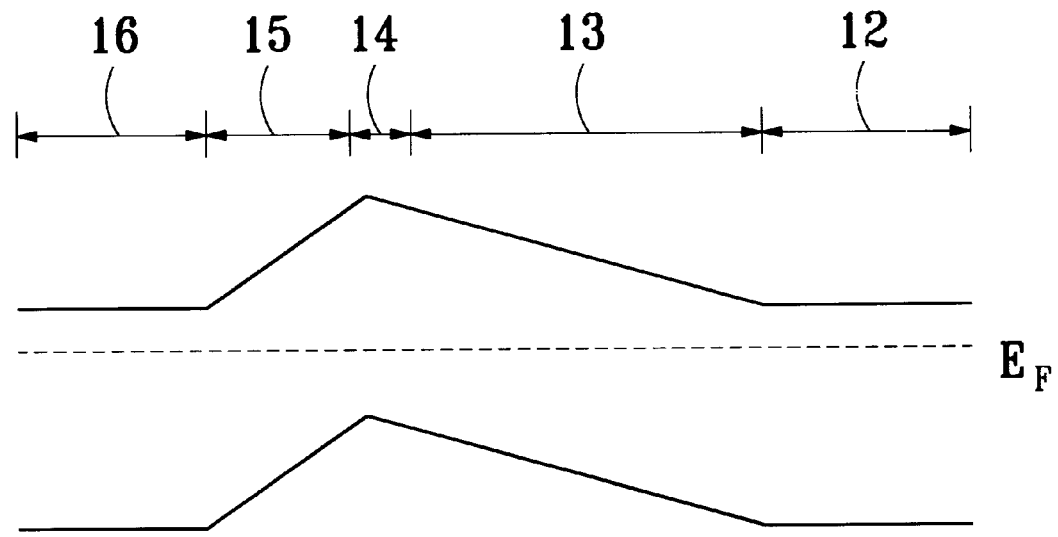
FIG. 2a is an energy band diagram of n-i-p-i-n type monocrystal SiC phototransistor under static equilibrium.
Figure 2B:
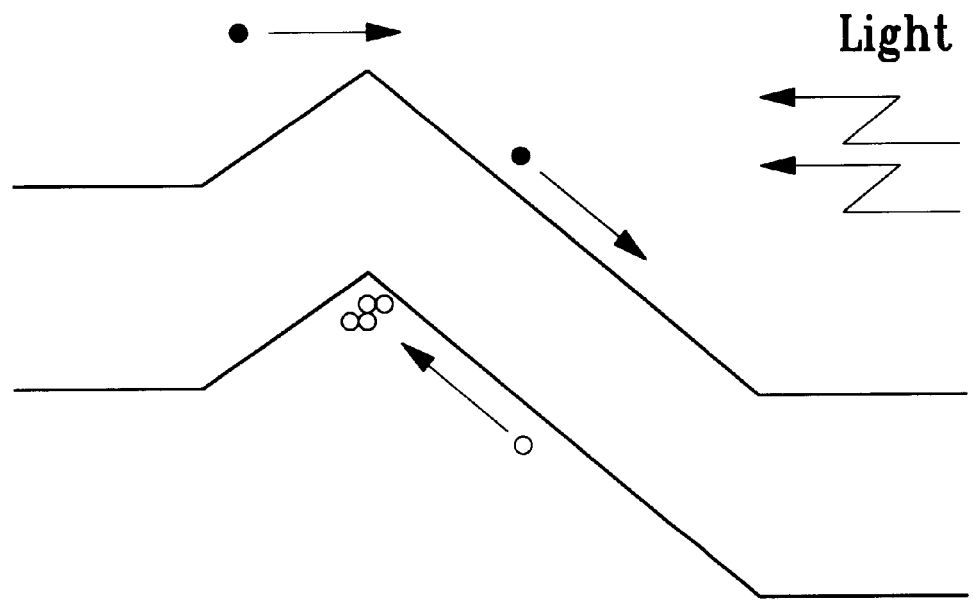
FIG. 2b is an energy band diagram of n-i-p-i-n type monocrystal SiC phototransistor under normal bias and illumination.
Figure 3A:
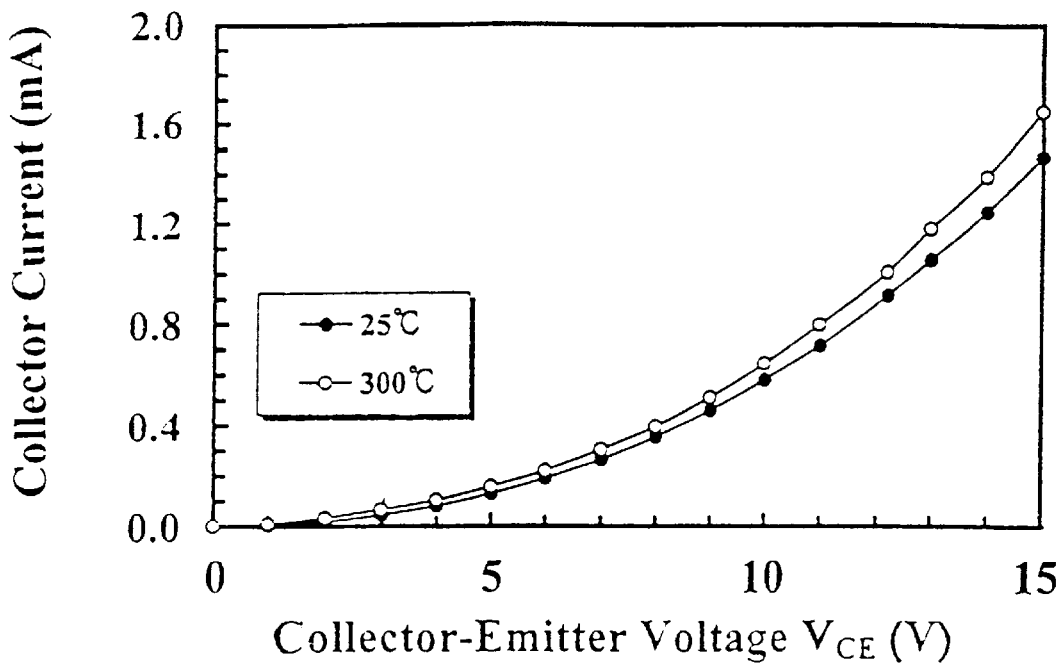
FIG. 3a denotes i-v relations under room temperature at 25° C. and high temperature at 300° C. (photocurrent induced); A wavelength 500 nm, power 10 $\mu$W incident light is applied.
Figure 3B:
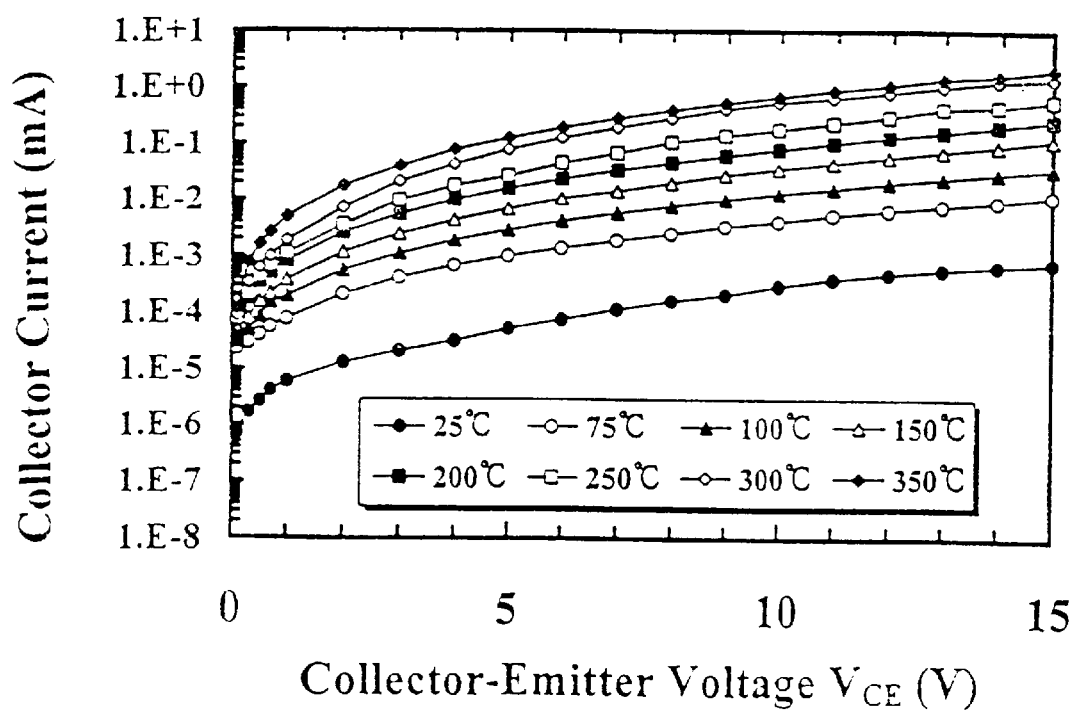
FIG. 3b denotes i-v relations under room temperature at 25° C. and high temperature at 350° C. (dark current existed); No incident light applied.
Figure 4:
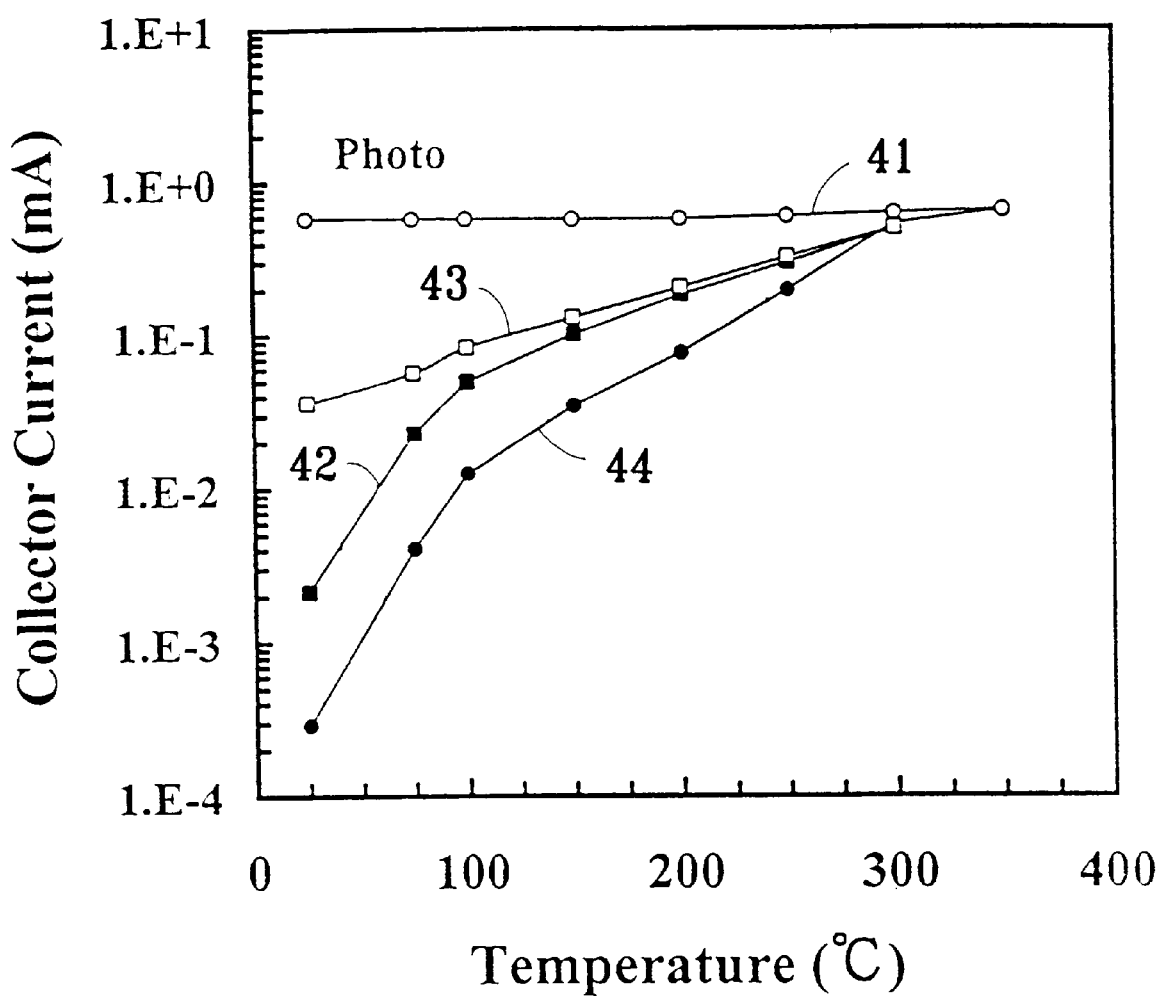
FIG. 4 illustrates relations of temperature to photocurrent/dark current in n-i-p-i-n and n-p-n monocrystal SiC phototransistors.
Figure 5:
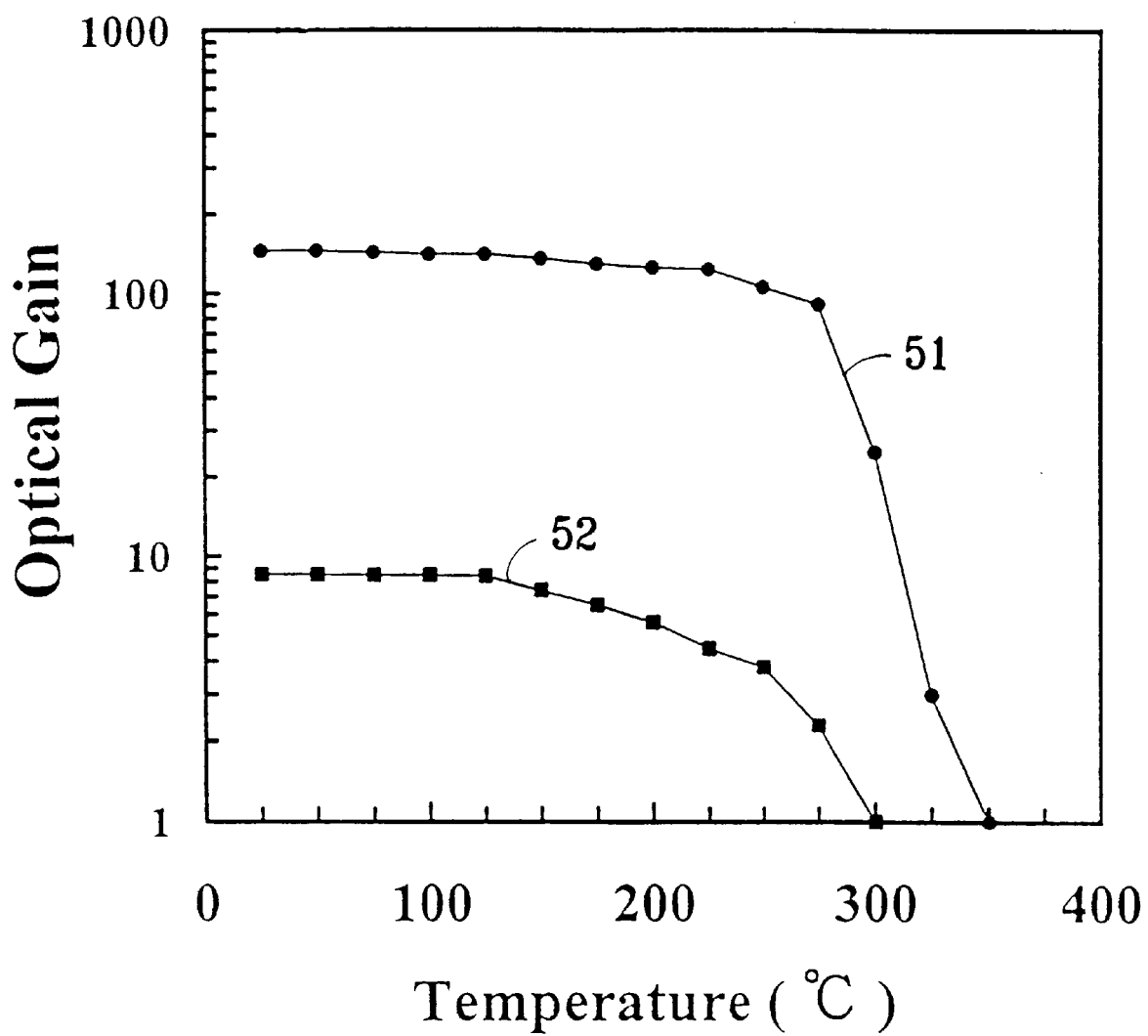
FIG. 5 denotes relations between optical gain and temperature.
Figure 6:
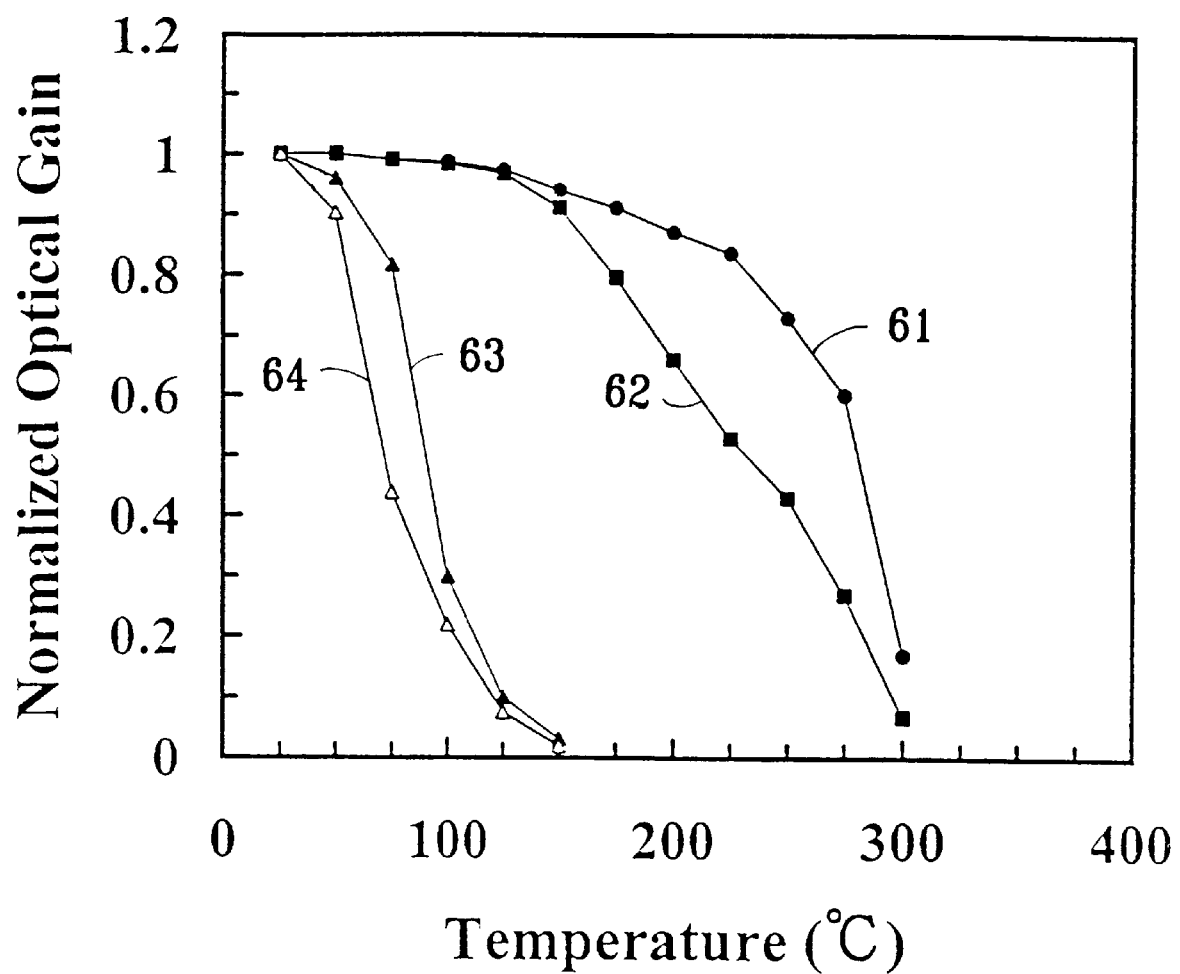
FIG. 6 compares relations of temperature-optical gain between SiC and Si phototransistors.

Please refer to the detailed description and appended diagrams concerning a preferred embodiment of this invention to be depicted below for further understanding to technique contents and effects:

FIG. 1 denotes the structure of n-i-p-i-n type monocrystal phototransistor comprising layers in sequence as collector electrode (ITO)/collector (n-type monocrystal SiC)/$i_1$ low impurity layer (i-type monocrystal SiC)/base (p-type monocrystal SiC)/$i_2$ low impurity layer (i-type monocrystal SiC)/emitter (n-type monocrystal SiC)/emitter electrode (Ni). A n-(III)silicon wafer serves as the substrate, and a buffer layer employed to reduce bad effect owing to lattice mismatch between silicon and Silicon Carbide for growing better quality SiC film;

FIG. 2 is an energy band diagram of n-i-p-i-n type monocrystal SiC phototransistor;

FIG. 2a is an energy band diagram of n-i-p-i-n type monocrystal SiC phototransistor under static equilibrium;

FIG. 2b is an energy band diagram of n-i-p-i-n type monocrystal SiC phototransistor under normal bias and illumination;

FIG. 3 denotes i-v relations under different temperatures of n-i-p-i-n type monocrystal SiC phototransistor, it is obvious that the photocurrent is relatively temperature-independent while dark current is affected much more;

FIG. 4 illustrates relations of temperature to photocurrent/dark current in n-i-p-i-n and n-p-n monocrystal SiC phototransistors; test made under 10-V bias and an incident light of 10 $\mu$W 500 nm, concludes that photocurrent of n-i-p-i-n type monocrystal SiC phototransistor suffers the slightest effect by temperature changes;

FIG. 5 denotes relations between optical gain and temperature, wherein the optical gain is obtained from formula S. M. Sze, Physics of Semiconductor, $2^{nd}$ ed., New York: Wiley, 1981

$$G=[(I_C-I_D)/q] \times [hv/p_{in}]$$
$$=[I_C-I_D]/(P_{in} \times \lambda)] \times [hc/q]$$

where Ic is photocurrent, $I_D$ dark current, Pin power of incident light, hv incident photon energy, $\lambda$ wavelength of incident light. Under some designated conditions as of 10-V bias 25° C. and an incident light of 10 $\mu$W with 500 nm wavelength, the optical gain of n-i-p-i-n type monocrystal SiC phototransistor is about 145, while that of n-p-n type is 8 only. It is worthy of attention, the n-i-p-i-n type monocrystal SiC phototransistor can sustain a high-gain of 106 even at 250° C., which reveals a latent potential at high temperature operation;

FIG. 6 compares relations of temperature-optical gain between SiC and Si phototransistors, wherein a sharp cliff is found around 100° C. for Si phototransistor while SiC phototransistor maintains a relatively wide plateau until 200° C. This fact confirms that SiC is better than Si as a material for fabrication of high temperature phototransistors.

[Preferred embodiment 2]

Please refer to the detailed description and appended diagrams concerning a preferred embodiment of this invention to be depicted below for further understanding of the fabrication process:

[1] The 1st step is disassembled into :1-1 To clean and prepare silicon wafers for serving as substrates; 1-2 To move wafers into growing system; 1-3 To evacuate the air till a vacuum of $10^{-6}$ Torr achieved; 1-4 To elevate temperature to 900° C.; 1-5 To introduce HCL(10 sccm) and $H_2$(1.21 pm) into the growing system and keeping pressure at 2.5 Torr for 10 minutes in order to remove oxidized layer on the wafers; 1-6 To cool down chamber to room temperature and repeat 1-3.

[2] The 2nd step is to grow a buffer layer at 2250 Å on the wafer: 2-1 To introduce $SiH_4$(12 sccm) and $H_2$(1.21 pm) into the growing system and keep pressure at 2.5 Torr; 2-2 To raise temperature till 1200° C.; 2-3 To introduce $C_3H_8$ into the growing system at flow rate increasing from 0 to 10 sccm gradually.

[3] The 3rd step is to grow a layer of n-type monocrystal SiC film ($n_2$-layer) at thickness 550 Å as the emitter; Growing conditions including 10 sccm $C_3H_8$, 12 sccm $PH_3$, 12 sccm $SiH_4$, 1.21 pm $H_2$, 2.5 Torr, 1200° C.

[4] The 4th step is to grow a layer of $P^-$ type monocrystal SiC film ($i_2$-layer) at thickness 550 Å as a low impurity layer; conditions including 10 sccm $C_3H_8$, 0.03 sccm $B_2H_6$, 12 sccm $SiH_4$, 1.21 pm $H_2$, 2.5 Torr, 1200° C.

[5] The 5th step is to grow a layer of p-type monocrystal SiC film at thickness 150 Å as the base, conditions including 10 sccm $C_3H_8$, 12 sccm $B_2H_6$, 12 sccm $SiH_4$, 1.21 pm $H_2$, 2.5 Torr, 1200° C.

[6] The 6th step is to grow a layer of p type monocrystal SiC film ($i_1$-layer) at thickness 5500 Å as a low impurity layer, conditions including 10sccm $C_3H_8$, 0.03 sccm $B_2H_6$, 12 sccm $SiH_4$, 1.21 pm $H_2$, 2.5 Torr, 1200° C.

[7] The 7th step is to grow a layer of n-type monocrystal SiC film at thickness 250 Å as the collector, conditions including 10 sccm $C_3H_8$, 12 sccm $B_2H_6$, 12 sccm $SiH_4$, 1.21 pm $H_2$, 2.5 Torr, 1200° C.

[8] The 8th step is to utilize photo-mask and plasma for engraving to form an emitter connecting section, and setting the element's area.

[9] The 9th step is to electroplate the emitter electrode connecting section with Nickel, then, an annealing process of 700° C.(-)30sec required to form the emitter electrode.

[10] The final step is to plate the collector with transparent electrode (ITO) to form the collector electrode.

[Features and merits]

1. This invention can improve the optical gain of n-i-p-i-n type monocrystal SiC phototransistors to a great extent, far larger than that of n-p-n type which has a poor optical gain (about 8) at room temperature.

2. This invention is applicable under high temperature. An n-i-p-i-n type monocrystal SiC phototransistor can still keep its optical gain about 106 at 250° C., and hereby We deeply believe that our invention is probable a break-through for fabricating the semiconductor photodetectors. Relatively speaking, most part of the present so-called high-gain photodetectors can only operate at temperature less than 100° C.

3. The fabrication process of the present invention is compatible with that of Silicon made ICs. This compatibility is advantageous for cost consideration and is instrumental to further developments.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A high-gain phototransistor with multiple mono-crystalline silicon-carbide (SiC) layers on a silicon substrate comprising:

a silicon substrate made from an n-type, (111) oriented silicon wafer;

a 2250-Å buffer layer grown on the substrate;

a 550-Å -n-type mono-crystalline SiC layer serving as the emitter layer, grown on the buffer layer;

a 550-Å low-impurity p-type mono-crystalline SiC layer, grown on the emitter layer;

a 150-Å p-type mono-crystalline SiC layer serving as the base layer, grown on the 550-Å low-impurity p-type mono-crystalline SiC layer;

a 5500-Å low-impurity p-type mono-crystalline SiC layer, grown on the base layer;

a 250-Å thick, n-type mono-crystalline SiC layer serving as the collector layer, grown on the 5500-Å low-impurity p-type mono-crystalline SiC layer;

an Indium Tin Oxide (ITO) layer serving as the collector electrode; formed on the said collector layer, nickel metal layer serving as the emitter electrode, formed on the exposed region of the emitter layer.

2. A high-gain phototransistor with multiple mono-crystalline SiC layers on a silicon substrate according to claim 1, wherein said buffer layer, emitter layer, 550-Å low-impurity p-type mono-crystalline SiC layer, base layer, 5500-Å low-impurity p-type mono-crystalline SiC layer, and collector layer are successively grown by a Rapid-Thermal-Chemical-Vapor-Deposition (RTCVD) method.

3. A high-gain phototransistor with multiple mono-crystalline SiC layers on a silicon substrate according to claim 1, wherein said buffer layer is grown using a mixed reaction gas of 12 sccm $SiH_4$, 1.21 pm $H_2$ and $C_3H_8$ with a flow rate increasing gradually from zero to 10 sccm, keeping the growth pressure at 2.5 torr, at 1200° C.

4. A high-gain phototransistor with multiple mono-crystalline SiC layers on a silicon substrate according to claim 1, wherein said emitter layer is grown using a mixed reaction gas of 10 sccm $C_3H_8$, 12 sccm $SiH_4$, 12 sccm $PH_3$, and 1.21 pm $H_2$, keeping the growth pressure at 2.5 torr, at 1200° C.

5. A high-gain phototransistor with multiple mono-crystalline SiC layers on a silicon substrate according to claim 1, wherein the 550-Å low-impurity p-type mono-crystalline SiC layer is grown using a mixed reaction gas of 10 sccm $C_3H_8$, 12 sccm $SiH_4$, 0.03 sccm $B_2H_6$, and 1.21 pm $H_2$, keeping the growth pressure at 2.5 torr, at 1200° C.

6. A high-gain phototransistor with multiple mono-crystalline SiC layers on a silicon substrate according to claim 1, wherein said base layer is grown using a mixed reaction gas of 10 sccm $C_3H_8$, 12 sccm $SiH_4$, 12 sccm $B_2H_6$, and 1.21 pm $H_2$, keeping the growth pressure at 2.5 torr, at 1200° C.

7. A high-gain phototransistor with multiple mono-crystalline SiC layers on a silicon substrate according to claim 1, wherein the 5500-Å low-impurity p-type mono-crystalline SiC layer is grown using a mixed reaction gas of 10 sccm $C_3H_8$, 12 sccm $SiH_4$, 0.03 sccm $B_2H_6$, and 1.21 pm $H_2$, keeping the growth pressure at 2.5 torr at 1200° C.

8. A high-gain phototransistor with multiple mono-crystalline SiC layers on a silicon substrate according to claim 1, wherein said collector layer is grown using a mixed reaction gas of 10 sccm $C_3H_8$, 12 sccm $SiH_4$, 12 sccm $PH_3$, and 1.21 pm $H_2$, keeping the growth pressure at 2.5 torr, at 1200° C.

9. A high-gain phototransistor with multiple mono-crystalline SiC layers on a silicon substrate according to claim 1, which has an optical gain of about 106 at 250° C.

* * * * *